United States Patent [19]

Hsu

[11] Patent Number: 4,675,984
[45] Date of Patent: Jun. 30, 1987

[54] METHOD OF EXPOSING ONLY THE TOP SURFACE OF A MESA

[75] Inventor: Sheng T. Hsu, Lawrenceville, N.J.

[73] Assignee: RCA Corporation, Princeton, N.J.

[21] Appl. No.: 777,736

[22] Filed: Sep. 19, 1985

[51] Int. Cl.[4] .......................................... H01L 21/318
[52] U.S. Cl. ........................................ 29/578; 29/571;
    29/576 W; 29/580; 148/DIG. 50; 156/649;
    156/653; 357/56; 427/94
[58] Field of Search ...................... 29/571, 576 W, 578,
    29/580; 148/DIG. 50; 156/649, 652, 653, 657;
    357/56, 49; 427/93, 94

[56] References Cited

U.S. PATENT DOCUMENTS

| 4,384,301 | 5/1983 | Tasch et al. | 357/23 |
| 4,518,629 | 5/1985 | Jeuch | 156/653 |
| 4,536,249 | 8/1985 | Rhodes | 156/653 |

FOREIGN PATENT DOCUMENTS

| 31686 | 10/1977 | Japan | 156/657 |
| 201242 | 6/1983 | Japan | 29/576 W |
| 175135 | 10/1984 | Japan | 29/576 W |
| 9140 | 1/1985 | Japan | 29/576 W |

OTHER PUBLICATIONS

Jombotkar, "Resistors with Submicron Width", I.B.M. Tech. Discl. Bulletin, vol. 24, #12, 5/82.
Ghandi, VLSI Fabrication Principles, Silicon and Gallium Arsenide, John Wiley & Sons, New York, 1983, pp. 392 & 393.
Jambotkar, "High Performance FET Technology" IBM Tech. Discl. bulletin, vol. 23, #11, 4/81, pp. 4950–4953.

Primary Examiner—Brian E. Hearn
Assistant Examiner—T. N. Quach
Attorney, Agent, or Firm—Joseph S. Tripoli; Fred Jacob; James M. Trygg

[57] ABSTRACT

A method of exposing only the top surface of a narrow mesa is disclosed wherein a protective layer may be very precisely formed on a very narrow mesa for subsequent doping of areas adjacent the mesa without doping the mesa itself. A variation of the invention includes forming an opening directly over the narrow mesa so that a contact may be made at only the top surface of the mesa or the upper portion of the mesa may be doped independent of surfaces adjacent the mesa.

4 Claims, 13 Drawing Figures

METHOD OF EXPOSING ONLY THE TOP SURFACE OF A MESA

This invention relates to a method of forming a semiconductor device and more particularly to a method of exposing only the top surface of a narrow mesa projecting from a surface of the device.

BACKGROUND OF THE INVENTION

Photolithography and laser writing are processes that are typically utilized when defining regions or portions of surfaces in the manufacture of semiconductor devices. The resolving power inherent in these processes is adequate when working with feature sizes larger than about three microns. When it is desired to form a contact opening, for example through a layer of silicon oxide, to expose only the top surface of a very narrow feature, such as a one micron gate, it is quite difficult to adequately align the opening. Often, such openings extend beyond the lateral limits of the gate resulting in the metal contact shortng out the transistor. Similarly, when it is desired to dope regions of a semiconducting body formed on both sides of a very narrow mesa without doping the mesa itself, these processes are not helpful.

The present invention is a process of the self-aligning type which permits defining a portion of only the top surface of a very narrow mesa. The portion of the top surface may then receive a protective layer to prevent doping of the mesa while forming doped regions in the semiconductor body adjacent the mesa. Optionally, the portion of the top surface may be exposed for subsequent doping of that surface or formation of an ohmic contact thereon without shorting to adjacent regions.

SUMMARY OF THE INVENTION

According to the present invention there is disclosed in a method of making a semiconducting device the steps of: providing a mesa projecting from a first surface of the device, the mesa having a top surface spaced from the first surface; providing a first layer on and topologically conformal to the first surface and the mesa; providing a planarizing second layer on the first layer having a major surface that is substantially planar and approximately parallel to the first surface; and etching the second layer to expose a portion of the first layer opposed to the mesa and removing the portion of the first layer to expose only the top surface of the mesa.

DESCRIPTION OF THE PREFERRED EMBODIMENT

Figure 1:
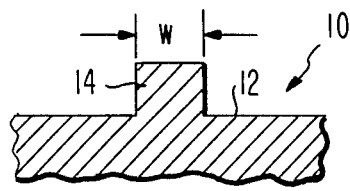
FIGS. 1 through 4 are schematic representations of cross-sectional views of a portion of a semiconductor device showing various steps of manufacture of the device utilizing the teachings of the present invention.

There is shown in FIGS. 1 through 4 a portion of a semiconductor device 10 having a surface 12. A mesa 14 having a width indicated by W is formed on the device 10 and projects above the surface 12 as shown in FIG. 1. The mesa 14 is formed in any suitable manner that is well known in the art. The purpose of the mesa 14 is unimportant with respect to this disclosure, however, it may ultimately become a gate of an MOS device or some other functional element of a semiconductor device. The important characteristic of the mesa 14 with respect to the present invention is that its width W be about two microns or less. It will be understood, however, that while the present invention is most advantageously applied to mesas having a width of about two microns or less, it may also be applied to mesas having widths over two microns.

A first layer 20 of silicon nitride about 20 nm thick is formed on the surface 12, the top surface 22 and the sidewalls 24 of the mesa 14. The layer 20 is topographically conformal to the surface 12, that is, it maintains an approximately even thickness as it follows the surface 12 and extends up and over the mesa 14. A planarizing second layer 26 is then formed on the first layer 20 and has a major surface 28 that is substantially planar. The layer 26 is formed in any manner that is well known in the art such as applying spin-on-glass in liquid form to the surface of the device, spinning the device, then hard baking at a temperature of about 100° C. to 350° C. for about 30 to 60 minutes. The second layer 26 may be of any suitable material such as spin-on glass that will form the desired planar surface 28. While, in the present example, the second layer 26 is about 200 nm thick, its thickness is not critical to the operation of the invention, the only requirement being that the resulting surface 28 completely or very nearly cover the first layer 20 and be substantially planar.

The device 10 is then subjected to any suitable planar etch that will etch both silicon nitride and the material of the second layer 26 at approximately the same rate. The planar etch procedure is such that material is removed substantially evenly from the surface 28 of the layer 26 so that the surface 28 gradually receeds toward the surface 12 while remaining substantially parallel thereto. As the surface 28 reaches the position indicated by the dashed line 30 in FIG. 3, the top most portion 32 of the layer 20 of silicon nitride becomes exposed to the etch. Since the materials of the two layers 20 and 26 will etch at approximately the same rate, the top most portion 32 will be completely etched away as the surface 28 reaches the position shown at 36 in FIG. 4. This exposes the top surface 40 of the mesa 14. At this point, the remaining portions of the planarizing layer 26 may be removed or retained as desired.

Figure 5:
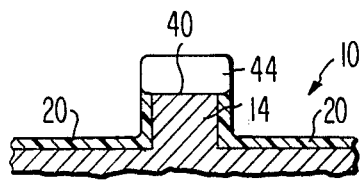
FIGS. 5 and 6 are similar to FIG. 4 showing a variation thereof.
Figure 6:
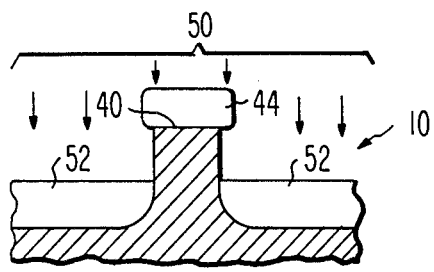

As shown in FIGS. 5 and 6, a protective layer 44 of silicon oxide is grown on the top surface 40 of the mesa 14 in the usual manner. The silicon nitride layer 20 is then removed and the device subjected to a doping implant indicated by the arrows 50 in FIG. 6. This effectively forms the doped regions 452 adjacent the mesa 14 without doping the mesa itself. It will be understood that the power level used when implanting will determine the thickness of the protective layer 44 required to prevent doping of the mesa 14.

In the case where it is desired to form a doped region in the top surface 40 of the mesa 14, the device 10 may be subjected to an ion implanting or diffusing process after the top surface 40 is exposed by the planar etch and prior to removing the silicon nitride layer 20. This, of course, would obviate the need for the protective layer 44. In this way the upper portion of the mesa 14 can be doped without adding impurities to adjacent areas.

A second embodiment of the present invention is depicted in FIGS. 7 through 10 where there is shown a device 100 including a surface 12 and a mesa 14 having a top surface 40 and a width W. Indicator numbers similar to those used for the device 10 indicate similar materials and functions for the device 100. A composite layer 58 comprising a layer 60 of high temperature dielectric material and a layer 62 of silicon nitride is formed on the surface 12 in any suitable manner. In the present example, the layer 60 is silicon dioxide having a thickness of about 500 mn and the layer 62 of silicon nitride has a thickness of about 30 and 50 nm. It is necessary that the layers 60 and 62 be etchable by different etchants, that is, that the etchant used to etch the layer 60 will not substantially affect the layer 62 and the etchant used to etch the layer 62 will not substantially affect the layer 60. While, in the present example, the layer 60 is formed on the surface 12 and the layer 62 is formed on the layer 60, their respective positions are not important, and in fact, those layers may be reversed. That is, the layer 62 may be formed on the surface 12 and the layer 60 formed on the layer 62. As with the layer 20, both layers 60 and 62 are topographically conformal to their respective underlying surfaces.

A planarizing fourth layer 64 is then formed on the third layer 62 and has a major surface 66 that is substantially planar. The procedure and material used in forming the fourth layer 64 are similar to those used in forming the second layer 26.

The device 100 is then subjected to a suitable planar etch that will etch both the layers 62 and 64 at approximately the same rate. The etch procedure is similar to that described for the device 10 in that material is removed substantially evenly from the surface 66 of the layer 64 so that the surface 66 gradually receeds toward the surface 12 while remaining substantially parallel thereto. As the surface 66 reaches the position indicated by the dashed line 68 in FIG. 8, the top most portion of the layer 62 of silicon nitride becomes exposed to the etch. The etch process continues until the surface 66 reaches the position indicated by 70 in FIG. 9 where the top most portion of the layer 62 is completely etched away. This exposes a surface 74 of the layer 60 which is of substantially the same size as, directly above, and in alignment with the mesa 14, as viewed in FIG. 9.

Figure 7:
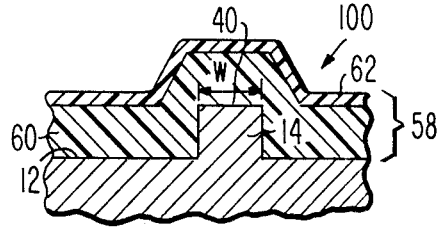
FIGS. 7 through 10 are similar to FIGS. 2 through 4 showing a second embodiment of the invention.

The device 100 is then subjected to a suitable planar etch that will etch only the exposed portion of the layer 60. This results in the formation of an opening 78 completely through the layer 60, exposing the top surface 40 of the mesa 14. At this point a contact may be formed on the top surface 40, the upper portion of the mesa 14 may be suitably doped, or some other desirable operation may be performed with respect to the top surface 40. It will be understood that this procedure for forming the opening 78, as described above, is independent of the width W of the mesa 14 as shown in FIG. 7. Because the procedure is self-aligning, the width W of the mesa 14 may be less than two microns without danger of the opening 78 exposing a portion of the surface 12 adjacent the mesa 14.

Figure 2:
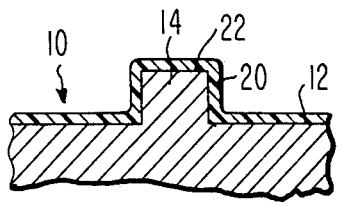
Figure 3:
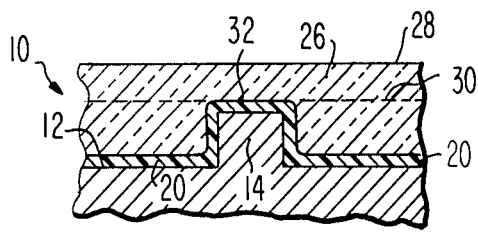
Figure 4:
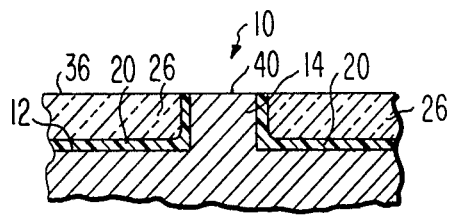
Figure 11:
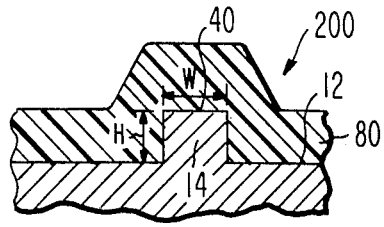
FIGS. 11 through 13 are similar to FIGS. 2 through 4 showing a third embodiment of the invention.
Figure 8:
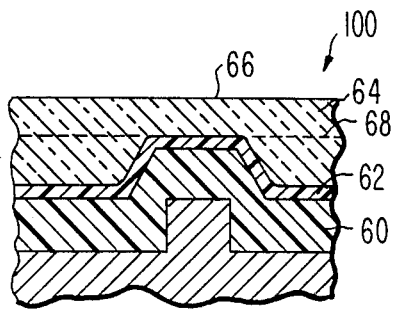
Figure 12:
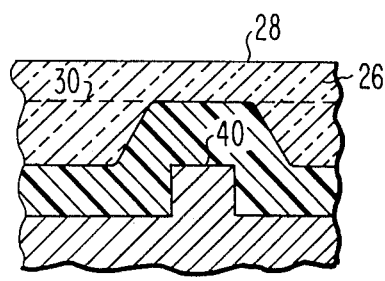
Figure 9:
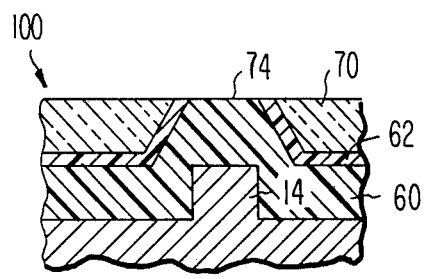
Figure 13:
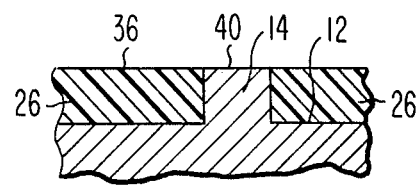
Figure 10:
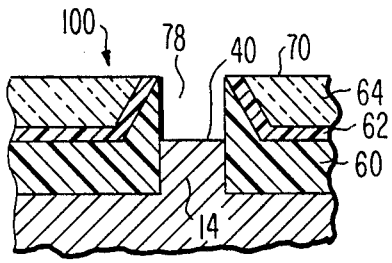

A third embodiment of the present invention is depicted in FIGS. 11, 12, and 13 where there is shown a device 200 including a surface 12 and a mesa 14 having a top surface 40, a height H, and a width W. A layer 80 of silicon oxide is formed on the surface 12 and is topographically conformal thereto as described above for the device 10. The device 200 is similar to the device 10 as shown in FIGS. 2, 3, and 4 except that the layer 80 of silicon oxide has a thickness slightly greater than the height H of the mesa 14. A planarizing layer 26 having a planar surface 28 is formed on the layer 80 similar to that of the device 10 and subjected to a similar planar etch. The material used for the planarizing layer 26 must have an etch rate that is similar to that of the silicon oxide layer 80 so that the surface 28 etches evenly past the position indicated by the dashed lines at 30 in FIG. 12 to the position indicated as 36 in FIG. 13. At this point the top surface 40 of the mesa 14 is exposed while the surface 12 adjacent the mesa 14 is covered by a protecting layer 26 of silicon oxide. As with the device 100, a contact may now be formed on the top surface 40 of the device 200, or the upper portion of the mesa 14 may be suitably doped or some other desirable operation performed with respect to the top surface 40.

A very important advantage of the present invention is the characteristic self-alignment of the protective layer 44, the opening 78, or the exposure of the top surface 40 with respect to the very narrow mesa 14. This characteristic self-alignment is inherent in the procedures taught by the present invention.

I claim:

1. In a method of making a semiconductor device, the steps of:
   (a) providing a mesa projecting from a first surface of said semiconductor device, said mesa having a top surface spaced from said first surface;
   (b) providing a first layer comprising a layer of high temperature dielectric and a layer of silicon nitride on and topographically conformal to said first surface and said mesa;
   (c) providing a planarizing second layer on said first layer, said second layer having a major surface that is substantially planar and approximately parallel to said first surface; and
   (d) planar etching said second layer to expose a portion of said first layer opposed to said mesa and removing said portion of said first layer to expose only said top surface of said mesa.

2. The method set forth in claim 1 wherein said removing said portion of said first layer as set forth in step (d) includes the steps:
   (d1) planar etching only said portion of said first layer through one of said layer of high temperature dielectric or said layer of silicon nitride thereby exposing a portion of the other layer; and
   (d2) etching through only said exposed portion of said other layer.

3. The method set forth in claim 2 wherein said forming a layer of high temperature dielectric as set forth in step (b1) comprises depositing a layer of silicon oxide.

4. The method set forth in claim 3 wherein said depositing a layer of silicon oxide is performed prior to said forming a layer of silicon nitride.

* * * * *